(12) United States Patent
Hayashi et al.

(10) Patent No.: US 11,421,323 B2
(45) Date of Patent: Aug. 23, 2022

(54) STAGE AND ELECTRODE MEMBER

(71) Applicant: Tokyo Electron Limited, Tokyo (JP)

(72) Inventors: Daisuke Hayashi, Miyagi (JP); Shinya Ishikawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 172 days.

(21) Appl. No.: 16/976,544

(22) PCT Filed: Jul. 8, 2019

(86) PCT No.: PCT/JP2019/027041
§ 371 (c)(1),
(2) Date: Aug. 28, 2020

(87) PCT Pub. No.: WO2020/017387
PCT Pub. Date: Jan. 23, 2020

(65) Prior Publication Data
US 2020/0407840 A1 Dec. 31, 2020

(30) Foreign Application Priority Data

Jul. 19, 2018 (JP) .............................. JP2018-136095

(51) Int. Cl.
*C23C 16/458* (2006.01)
*C23C 14/50* (2006.01)
(Continued)

(52) U.S. Cl.
CPC .......... *C23C 16/4586* (2013.01); *C23C 14/50* (2013.01); *C23C 16/458* (2013.01);
(Continued)

(58) Field of Classification Search
CPC ................ C23C 16/4586; C23C 14/50; C23C 16/45587; C23C 16/458; C23C 16/46;
(Continued)

(56) References Cited

U.S. PATENT DOCUMENTS

2003/0164226 A1* 9/2003 Kanno .............. H01L 21/67109
  438/758
2006/0174954 A1* 8/2006 Hasko ....................... F02G 5/00
  137/625.16
(Continued)

FOREIGN PATENT DOCUMENTS

JP 2006-286733 10/2006
JP 2008-187063 8/2008
(Continued)

*Primary Examiner* — Jeffrie R Lund
(74) *Attorney, Agent, or Firm* — Ipusa, PLLC

(57) ABSTRACT

A stage for mounting a workpiece and an edge ring is provided, the stage including a first flow path and a second flow path along each of which a fluid flows, within the stage; a bifurcation at which an inlet port of the first flow path and an inlet port of the second flow path are coupled; a junction at which an outlet port of the first flow path and an outlet port of the second flow path are coupled; and a member provided at least one of the bifurcation and the junction, the member having at least one opening that communicates with the first flow path and the second flow path.

14 Claims, 5 Drawing Sheets

(51) Int. Cl.
*C23C 16/46* (2006.01)
*H01J 37/32* (2006.01)
*C23C 16/455* (2006.01)
*H01L 21/3065* (2006.01)
*C23C 16/509* (2006.01)

(52) U.S. Cl.
CPC ........ *C23C 16/45587* (2013.01); *C23C 16/46* (2013.01); *C23C 16/463* (2013.01); *C23C 16/5096* (2013.01); *H01J 37/32715* (2013.01); *H01L 21/3065* (2013.01)

(58) Field of Classification Search
CPC ............... C23C 16/463; C23C 16/5096; H01J 37/32715; H01J 37/32642; H01L 21/3065; H01L 21/6831; H01L 21/68735; H01L 21/67109; H01L 21/6833; H01L 21/67069; H01L 21/68785; B23Q 3/15; H02N 13/00
See application file for complete search history.

(56) References Cited

U.S. PATENT DOCUMENTS

| | | | |
|---|---|---|---|
| 2014/0004706 A1* | 1/2014 | Miya | H01J 37/32825 156/345.37 |
| 2020/0075366 A1* | 3/2020 | Ulavi | F28F 3/14 |
| 2020/0286755 A1* | 9/2020 | Ito | H01L 21/67103 |
| 2020/0407840 A1* | 12/2020 | Hayashi | H01L 21/6831 |

FOREIGN PATENT DOCUMENTS

| | | | | |
|---|---|---|---|---|
| JP | 2009-117443 | 5/2009 | | |
| JP | 2011-035201 | 2/2011 | | |
| JP | 2013-161522 | 8/2013 | | |
| JP | 2018-110216 | 7/2018 | | |
| WO | WO-2020017387 A1 * | 1/2020 | ............. | C23C 14/50 |

* cited by examiner

… (1) …

STAGE AND ELECTRODE MEMBER

TECHNICAL FIELD

The present disclosure relates to a stage and an electrode member.

BACKGROUND

Patent document 1 discloses switching flow paths within a stage, with operation of on-off valves provided through flow path pipes. Patent document 2 discloses controlling an amount or a mixing ratio for a heat medium that flows to a flow path of the central portion and the outer periphery of the stage. These documents propose to control the temperature of the central portion and the outer periphery of a mounting surface of the stage on which a wafer is mounted.

CITATION LIST

[Patent Document]

[Patent document 1] Japanese Unexamined Patent Application Publication No. 2006-286733

[Patent document 2] Japanese Unexamined Patent Application Publication No. 2009-117443

SUMMARY

The present disclosure relates to a technique that can control an amount of heat reduction with respect to a stage on which a workpiece and an edge ring are mounted.

According to one manner of the present disclosure, a stage for mounting a workpiece and an edge ring is provided, the stage including a first flow path and a second flow path along each of which a fluid flows, within the stage; a bifurcation at which an inlet port of the first flow path and an inlet port of the second flow path are coupled; a junction at which an outlet port of the first flow path and an outlet port of the second flow path are coupled; and a member provided at least one of the bifurcation and the junction, the member having at least one opening that communicates with the first flow path and the second flow path.

Effects of the Invention

According to one aspect, an amount of heat reduction with respect to a stage on which a workpiece and an edge ring are mounted can be controlled.

DETAILED DESCRIPTION

One or more embodiments of the present disclosure will be hereinafter described with reference to the drawings. Note that in the specification and drawings, duplicate explanation for the substantially same configurations will be omitted by denoting the same numerals.

[Overall Configuration of Substrate Processing Apparatus]

Figure 1:
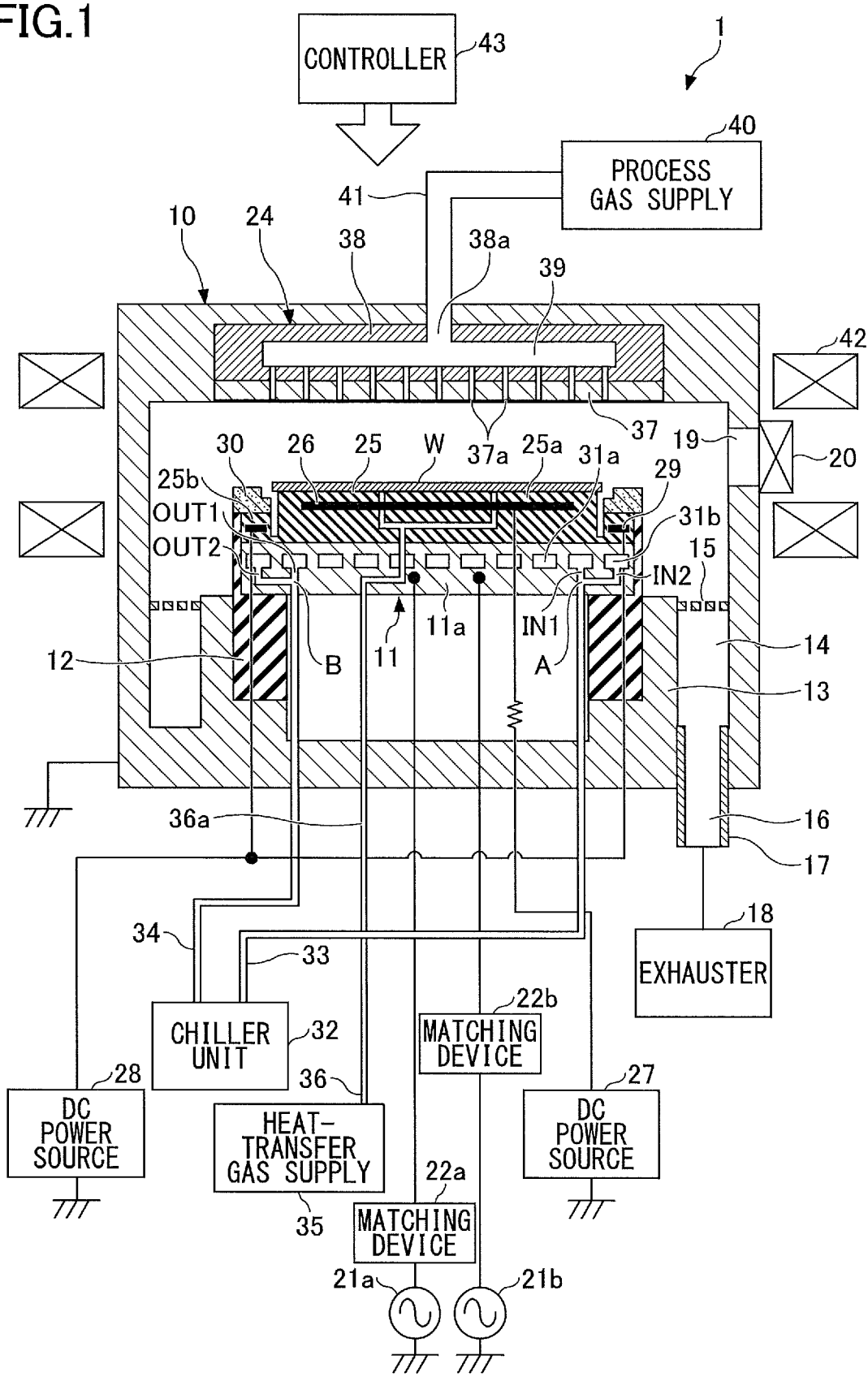
FIG. 1 is a view of an example of a substrate processing apparatus including a stage according to one embodiment.

First, an example of the overall configuration of a substrate processing apparatus 1 will be described with reference to FIG. 1. FIG. 1 is a cross-sectional view of a schematic configuration of the substrate processing apparatus 1 according to one embodiment. Note that in the present embodiment, an example in which the substrate processing apparatus 1 is a reactive ion etching (RIE) substrate processing apparatus will be described. However, the substrate processing apparatus 1 may include a plasma etching apparatus, a plasma chemical vapor deposition (CVD) apparatus, or the like.

In FIG. 1, the substrate processing apparatus 1 includes a cylindrical processing chamber 10 that is grounded and that is formed of metal, for example, aluminum or a stainless steel. A disc-shaped stage 11 for mounting a wafer W is disposed within the processing chamber 10. The stage 11 includes a base 11a and an electrostatic chuck 25. The electrostatic chuck 25 is disposed on the base 11a. The base 11a is formed by, for example, aluminum, and is supported by a cylindrical support 13 that extends vertically upwardly from the bottom of the processing chamber 10, through an insulating cylindrical holder 12.

An exhaust passage 14 is formed between the sidewall of the processing chamber 10 and the cylindrical support 13, and an annular baffle plate 15 is disposed at an inlet port of the exhaust passage 14 or at an intermediate portion of the exhaust passage 14. An exhaust port 16 is provided at the bottom of the processing chamber 10, and an exhauster 18 is connected to the exhaust port 16 via an exhaust pipe 17. The exhauster 18 includes a dry pump and a vacuum pump, and depressurizes a process space within the processing chamber 10, up to a predetermined vacuum level. The exhaust pipe 17 includes an automatic pressure control valve (hereinafter referred to as an "APC") that is a variable butterfly valve. The APC automatically controls the pressure of the processing chamber 10. Further, a gate valve 20 for the opening or closing of a carry gateway 19 for the wafer W is attached to the sidewall of the processing chamber 10.

A first radio frequency power source 21a is connected to the stage 11 via a first matching device 22a. A second radio frequency power source 21b is connected to the stage 11 via a second matching device 22b. The first radio frequency power source 21a supplies radio frequency power for plasma generation at a predetermined frequency (e.g., 100 MHz), to the stage 11. The second radio frequency power source 21b supplies, to the stage 11, radio frequency power for drawing ions, at a predetermined frequency (e.g., 13 MHz) less than the frequency of the radio frequency that is set by the first radio frequency power source 21a. Thereby, the stage 11 serves as a lower electrode.

On a ceiling of the processing chamber 10, a showerhead 24 that serves as an upper electrode is provided. Thereby, respective frequency voltages set at two frequencies are applied across the stage 11 and the showerhead 24, by the first radio frequency power source 21a and the second radio frequency power source 21b. Note that the showerhead 24 corresponds to an electrode member that faces the stage 11 on which the wafer W is mounted.

The electrostatic chuck 25 attracts the wafer W by an electrostatic attraction force. The electrostatic chuck 25 includes a disc-shaped central portion 25a and an annular outer periphery 25b that is formed to surround the central portion 25a. The central portion 25a protrudes upward in the figure, relative to the outer periphery 25b. The wafer W is mounted on the upper surface of the disc-shaped central portion 25a. An edge ring 30 that annularly surrounds the central portion 25a is mounted on the upper surface of the outer periphery 25b. The central portion 25a is constructed by interposing an electrode 26 formed of a conductive film, between a pair of dielectric films.

The outer periphery 25b is constructed by interposing an electrode 29 formed of a conductive film, between a pair of dielectric films. In such a manner, the electrode 29 is arranged to have a ring shape, under the edge ring 30. A DC power source 27 is connected to the electrode 26. A DC power source 28 is connected to the electrode 29. Each of the DC power source 27 and the DC power source 28 can vary a level and polarity of the DC voltage that is supplied. The DC power source 27 applies the DC voltage to the electrode 26, under a control of the controller 43. The DC power source 28 applies the DC voltage to the electrode 29, under a control of the controller 43. The electrostatic chuck 25 generates an electrostatic force such as a coulomb force, in accordance with the voltage applied to the electrode 26 by the DC power source 27. The electrostatic chuck 25 attracts the wafer W by the electrostatic force, for holding. The electrostatic chuck 25 also generates the electrostatic force such as a coulomb force, in accordance with the voltage applied to the electrode 29 by the DC power source 23. The electrostatic chuck 25 attracts the edge ring 30 by the electrostatic force, for holding.

For example, coolant flow paths 31a and 31b each extending in a circumferential direction are provided within the stage 11. The coolant flow path 31a is disposed in the central part of the stage 11, and the coolant flow path 31b is disposed in the outer periphery of the stage 11. The coolant flow path 31a is an example of a first flow path that is disposed at a location corresponding to the mounting surface of the stage 11 on which the wafer W is mounted. The coolant flow path 31b is an example of a second flow path that is disposed at a location corresponding to the mounting surface of the stage 11 on which the edge ring 30 is mounted.

The coolant at a predetermined temperature, e.g., cooling water, circulates from the chiller unit 32 via pipes 33 and 34, to be supplied to the coolant flow paths 31a and 31b. The temperature at which the wafer W on the electrostatic chuck 25 and the edge ring 30 are processed is controlled in accordance with the coolant temperature and a split ratio for the coolant that is diverted to the coolant flow paths 31a and 31b.

Specifically, the coolant at a predetermined temperature is discharged from the chiller unit 32, through a pump provided in the chiller unit 32, passes through the pipe 33, and is divided at a bifurcation A at which the pipe 33 branches to thereby flow to the coolant flow paths 31a and 31b. The bifurcation A couples an inlet port of the coolant flow path 31a and an inlet port of the coolant flow path 31b. The bifurcation A causes the coolant to flow, from the inlet port IN1 of the coolant flow path 31a and the inlet port IN2 of the coolant flow path 31b, into the respective coolant flow paths 31a and 31b, at a predetermined split ratio.

The coolant flow path 31a is formed on the mounting surface side of the base 11a on which the wafer W is mounted, and is formed in a spiral shape. The coolant diverted at the bifurcation A enters from the inlet port IN1 of the coolant flow path 31a, and flows along the spiral coolant flow path 31a, from the outer periphery side of the coolant flow path 31a and toward the inner periphery direction thereof. The coolant is turned back at the center of the coolant flow path 31a, flows from the inner periphery side of the coolant flow path 31a, toward the outer periphery direction thereof, and exits an outlet port OUT1 of the coolant flow path 31a.

The coolant flow path 31b is formed on the mounting surface side of the base 11a on which the edge ring 30 is mounted, and is formed in a ring shape. The coolant diverted at the bifurcation A enters from the inlet port IN2 of the coolant flow path 31b, flows along the ring-shaped coolant flow path 31b, and exits an outlet port OUT2 of the coolant flow path 31b.

Figure 2:
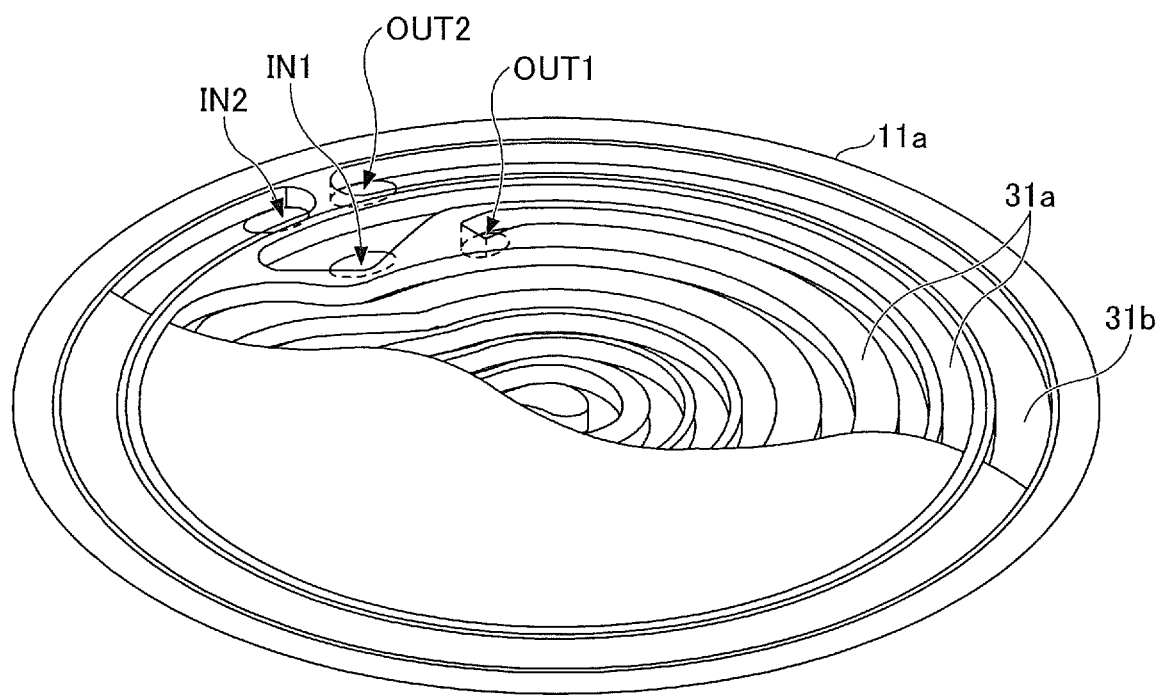
FIG. 2 is a diagram illustrating an example of flow paths in the stage according to one embodiment.

FIG. 2 is a diagram illustrating an example of the coolant flow paths 31a and 31b in the base 11a according to one embodiment. Note, however, that the shape of each of the coolant flow paths 31a and 31b illustrated in FIG. 2 is an example and is not limited thereto. For example, in FIG. 2, the coolant flow path 31a may be formed such that ring-shaped flow paths communicate with each other, or may be defined by a disk-shaped space. Further, for the coolant flow path 31a, a given flow path with respect to the inlet port IN1 is formed in the same direction as the flow path with respect to the outlet port OUT1. However, the coolant flow path 31a is not limited to the configuration described above, and may be formed such that a given flow path with respect to the inlet port IN1 is toward the direction opposite the flow path with respect to the outlet port OUT1. In FIG. 2, the coolant flow path 31b forms a single ring-shaped flow path, but may include multiple flow paths.

In such a configuration, the flow of the coolant is diverted at the bifurcation A illustrated in FIG. 1 flow along the respective coolant flow paths 31a and 31b, at a predetermined split ratio; meets at a junction B of the pipe 34 that couples the outlet port OUT1 of the coolant flow path 31a and the outlet port OUT2 of the coolant flow path 31b; and returns to the chiller unit 32. The coolant that is returned to the chiller unit 32 is again discharged from the chiller unit 32, in a state where the coolant is adjusted to a predetermined temperature, and circulates through the path described above.

A heat-transfer gas supply 35 is connected to the electrostatic chuck 25 via a gas supply line 36. The heat-transfer gas supply 35 supplies the heat transfer gas to a space interposed between the central portion 25a of the electrostatic chuck 25 and the wafer W, by using a wafer side line 36a extending to the central portion 25a of the electrostatic chuck 25.

The gas supply line 36 is not limited to including the wafer side line extending to the central portion 25a of the electrostatic chuck 25, and may include an edge ring side line (not illustrated) extending to the outer periphery 25b of the electrostatic chuck 25. In such a configuration, the heat-transfer gas supply 35 may supply the heat transfer gas to a space interposed between the outer periphery 25b of the electrostatic chuck 25 and the edge ring 30, by using the edge ring side line. As the heat transfer gas, a gas having heat conductivity, for example, a He gas or the like is preferably used.

The showerhead 24 on the ceiling includes an electrode plate 37 that is on the lower surface of the showerhead and that has multiple gas holes 37a, and includes an electrode support 38 that removably supports the electrode plate 37. A buffer chamber 39 is provided within the electrode support 38. A process gas supply 40 is connected to a gas inlet 38a that communicates with the buffer chamber 39, via a gas supply pipe 41. Magnets 42 each extending annularly or concentrically are disposed in the surroundings of the processing chamber 10.

Each component of the substrate processing apparatus 1 is connected to the controller 43. For example, the exhauster 18; the first radio frequency power source 21a; the second radio frequency power source 21b; the DC power sources 27 and 28, the chiller unit 32, the heat-transfer gas supply 35; and the process gas supply 40 are connected to the controller 43. The controller 43 controls each component of the substrate processing apparatus 1.

The controller 43 includes a central processing unit (CPU) and a memory (storage device) not illustrated. The controller 43 reads out a program and a process recipe stored in the storage device, and performs desired processing according to a procedure set by the program and the process recipe. For example, the controller 43 performs processing for electrostatically attracting the wafer W and the edge ring 30, as well as for controlling the temperature of the chiller unit 32.

In the processing chamber 10 of the substrate processing apparatus 1, a horizontal magnetic field toward one direction is produced by the magnets 42, and an RF electric field in the vertical direction is produced in accordance with the frequency voltage applied across the stage 11 and the showerhead 24. Thereby, a magnetron discharge through the process gas is achieved in the processing chamber 10, so that the process gas is formed into a plasma, proximal to the surface of the stage 11.

In the substrate processing apparatus 1, in a dry etching process, first, the gate valve 20 is opened, and the wafer W that is a process target is conveyed into the processing chamber 10 and is mounted on the electrostatic chuck 25. Then, in the substrate processing apparatus 1, the process gas supply 40 supplies the process gas (for example, a mixed gas of a $C_4F_3$ gas, a $O_2$ gas, and an Ar gas) to the processing chamber 10, at a predetermined flow volume and a predetermined flow rate, so that the pressure of the processing chamber 10 is set to a predetermined value by the exhauster 18 or the like.

Further, in the substrate processing apparatus 1, each of the first radio frequency power source 21a and the second radio frequency power source 21b supplies the radio frequency power to the stage 11. Further, in the substrate processing apparatus 1, the DC power source 27 applies the DC voltage to the electrode 26 of the electrostatic chuck 25, so that the wafer W is attracted to the electrostatic chuck 25. In the substrate processing apparatus 1, the DC power source 28 applies the DC voltage to the electrode 29 of the electrostatic chuck 25, so that the edge ring 30 is attracted to the electrostatic chuck 25. The process gas discharged from the showerhead 24 is formed into a plasma, in accordance with the radio frequency power, and thus the surface of the wafer W is processed by etching or the like, through radicals or ions in the plasma.

[Variable Ratio of Diverted Coolant Flow Rates]

Conventionally, at the bifurcation A, respective diverted flow rates of the coolant that flows to the side of the edge ring 30 being mounted; and the coolant that flows to the side of the wafer W being mounted, are set by a fixed ratio. However, with the recent diversification of processes, it becomes important to perform substrate processing allowing for increased accuracy of a temperature control for a given wafer W and the edge ring 30, by changing an amount of heat reduction at each of the side of the wafer W being mounted and the side of the edge ring being mounted, in accordance with a given process performed by the substrate processing apparatus 1.

In view of the point described above, the present embodiment provides a new configuration in which, for the stage 11 on which the wafer W and the edge ring 30 are mounted, a flow ratio of the coolants at the side of the wafer W being mounted; and the side of the edge ring 30 being mounted can be variable according to a process condition; an intended use; and a situation, so that the amount of heat reduction can be controlled.

Specifically, as illustrated in an example in FIG. 3(a), a fine adjustment member 50 according to one embodiment is removably disposed at the bifurcation A of the pipe 33. As illustrated in an example in FIG. 4, the fine adjustment member 50 is a hollow, cylindrical member and has openings 50a1 and 50a2 formed on the side surface of the fine adjustment member. In the following, the openings 50a1 and 50a2 are collectively referred to as openings 50a.

Referring back to FIG. 3, the fine adjustment member 50 is attached at the bifurcation A of the pipe 33, such that the opening 50a is formed facing a flow path 33a that communicates with the inlet port IN2 of the coolant flow path 31b. In such a configuration, the fine adjustment member 50 serves as a replaceable adapter that adjusts a flow ratio of the coolant that flows to the coolant flow path 31a and the coolant flow path 31b, in accordance with the area of the opening 50a.

Figure 3:
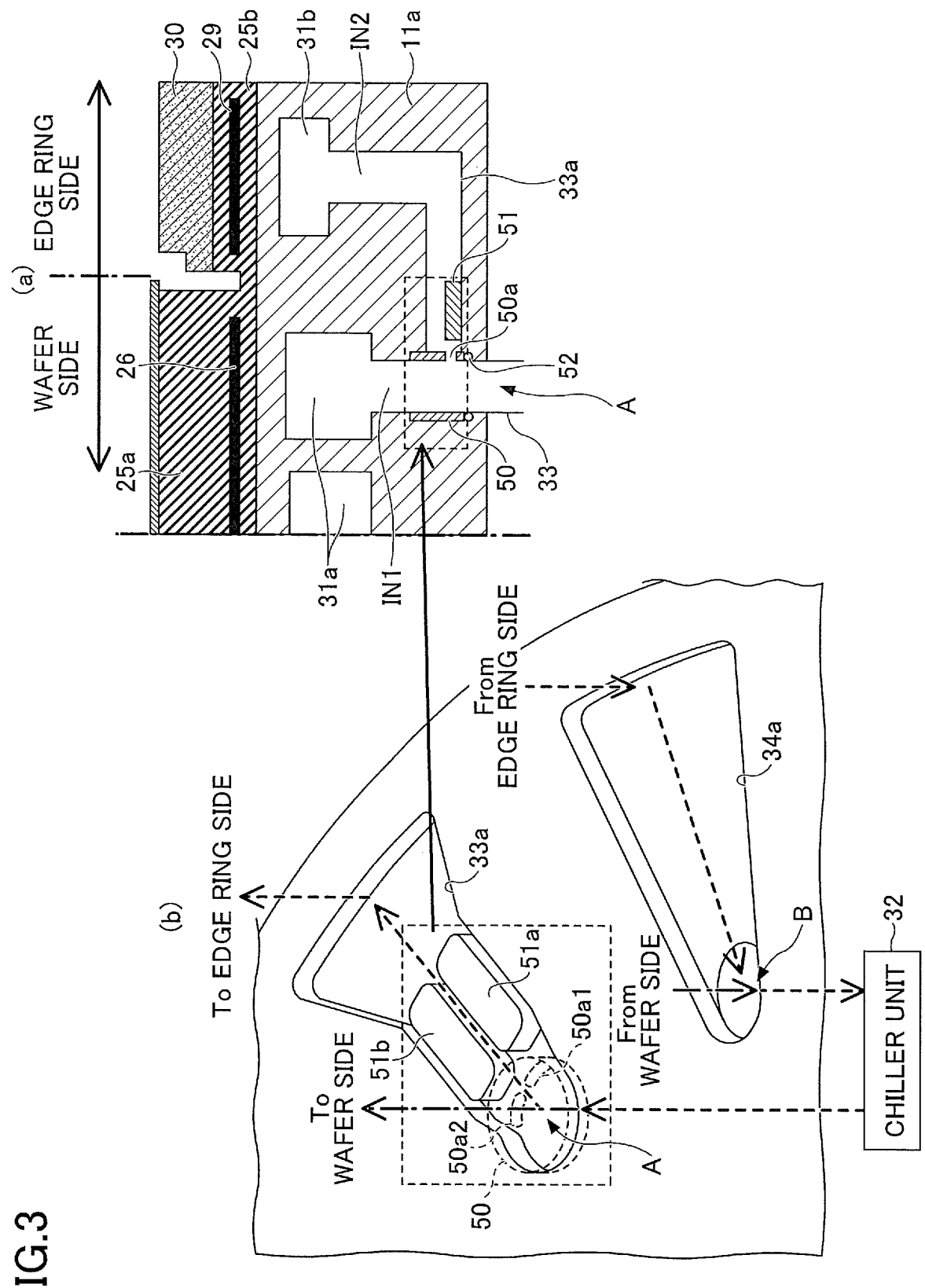
FIG. 3 is a diagram illustrating an example of the arrangement of a fine adjustment member and coarse adjustment members according to one embodiment.
Figure 4:
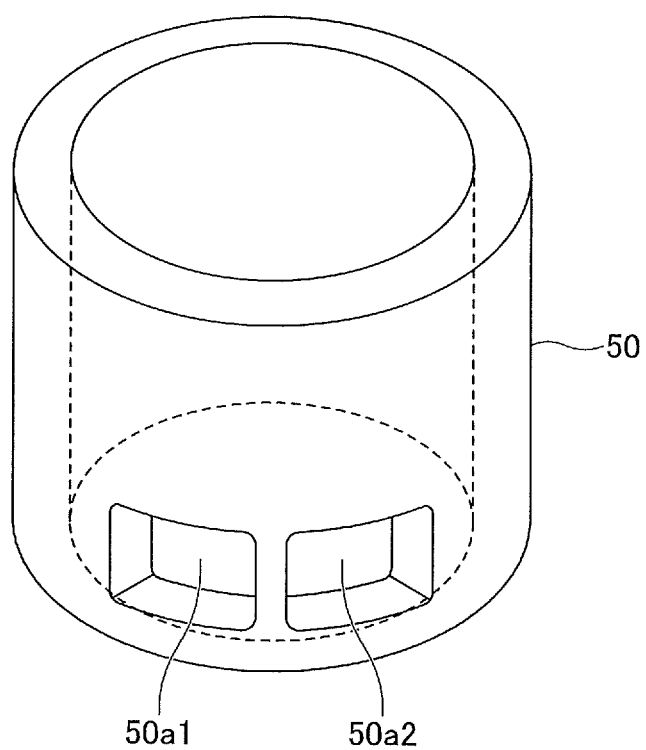
FIG. 4 is a diagram illustrating an example of the fine adjustment member according to one embodiment.

In the example of FIG. 3, as illustrated in FIG. 3(b), the fine adjustment member 50 has the two openings 50a1 and 50a2. However, for the opening 50a formed in the fine adjustment member 50, the number, the size, the shape, and the opening location are not limited to the example of FIG. 4. For example, the number of openings 50a may be one, or be two or more. The shape of the opening 50a may be a polygon such as a square, a circle, or a slit.

According to the present embodiment, a plurality of fine adjustment members 50 that differ in number, size, shape, and opening location of the opening 50a are prepared as replacement adapters, and a given fine adjustment member 50 that is disposed at the bifurcation A is appropriately replaced according to a process condition. Thus, by replacing the fine adjustment member 50 while the stage 11 itself is maintained commonly, pressure loss to the edge ring 30 can be changed. Accordingly, a split flow specification of the coolant at each of the side of the wafer W being mounted and the side of the edge ring 30 being mounted can be easily changed.

As described above, the fine adjustment member 50 is disposed to be able to be replaced. In such a manner, as illustrated in FIG. 3(a), an O-ring 52 for securing the fine adjustment member 50 is provided at the bottom of the fine adjustment member 50. Thereby, pressure variation due to a coolant leak from a space between the pipe 33 in which the fine adjustment member 50 is mounted, and the fine adjustment member 50, can be avoided. Further, when the fine adjustment member 50 is secured so as not to move in the pipe 33, particles are prevented from being formed due to the fine adjustment member 50 and the stage 11 rubbing against each other.

In a dotted line frame in FIG. 3(b), a perspective view of the flow path 33a that branches from the pipe 33 illustrated in a dotted line frame in FIG. 3(a), as well as of the surroundings of the flow path 33a, are taken. Coarse adjustment members 51a and 51b are disposed in the flow path 33a, in proximity to the bifurcation A and near the fine adjustment member 50. In the present embodiment, the two coarse adjustment members 51a and 51b are disposed at locations facing the respective openings 50a1 and 50a2 of the fine adjustment member 50. However, the coarse adjustment members are not limited to the configuration described above. The number of coarse adjustment members may be one, or be three or more. In the following, the coarse adjustment members 51a and 51b are collectively referred to as coarse adjustment members 51.

Figure 5:
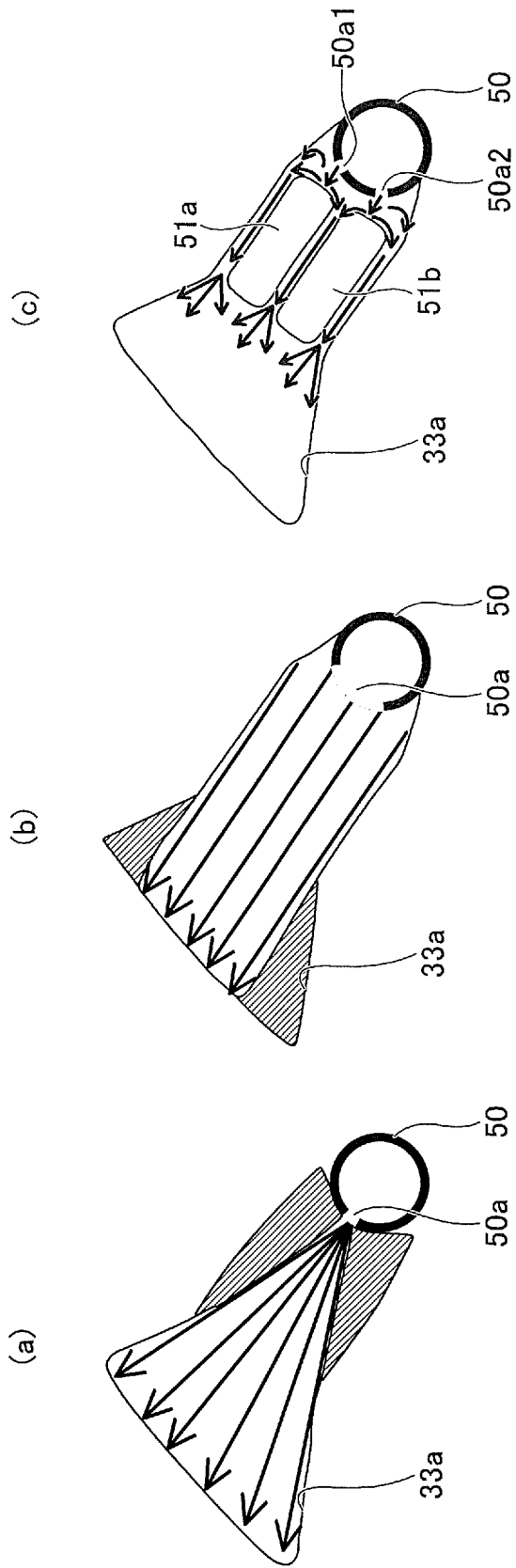
FIG. 5 is a diagram illustrating an example of the coarse adjustment members according to one embodiment.

Preferably, however, each coarse adjustment member 51 is provided at a location at which a coolant flow entering from the opening 50a of the fine adjustment member 50 is interrupted or disturbed. FIG. 5(c) is a diagram illustrating an example of the arrangement of the coarse adjustment members 51 according to one embodiment. In the example of FIG. 5(c), the coarse adjustment member 51a is disposed at a location facing the opening 50a1 of the fine adjustment member 50, and the coarse adjustment member 51b is disposed at a location facing the opening 50a2 of the fine adjustment member 50. Thereby, for the coolant that flows from the openings 50a1 and 50a2 of the fine adjustment member 50 to the flow path 33a, the flow is disturbed by the coarse adjustment members 51a and 51b. Then, while diffusing, the coolant flows, from a space between the flow path 33a and each of the coarse adjustment members 51a and 51b, to the coolant flow path 31b at the edge ring 30 side.

In contrast, in each of comparative examples in FIGS. 5(a) and 5(b), there is no coarse adjustment member 51 disposed. In such a manner, as illustrated in FIG. 5(a), when the opening 50a of the fine adjustment member 50 is smaller, there is an area that is on the front side (fine adjustment member 50 side) of the flow path 33a, as represented by diagonal lines, in which a fluid such as a coolant does not pass. Further, as illustrated in FIG. 5(b), when the opening 50a of the fine adjustment member 50 is larger, there is an area that is on the back side (side opposite the fine adjustment member 50) of the flow path 33a, as represented by diagonal lines, in which a fluid such as a coolant does not pass.

Such areas where the fluid does not pass are undesirable because residual coolant liquid remains in a brine purge. The brine purge means that when the electrostatic chuck 25 is removed from the substrate processing apparatus 1 for maintenance, the inside of the coolant flow paths 31a and 31b and the flow path 33a are purged using a $N_2$ gas or the like to thereby discharge the coolant (brine). In this regard, the coarse adjustment members 51a and 51b according to the present embodiment are disposed at the respective locations facing the openings 50a of the fine adjustment member 50, so that the $N_2$ gas or the like can sufficiently flow to the portion of the flow path 33a as represented by the diagonal lines in each of FIGS. 5(a) and 5(b). As a result, the inside of the coolant flow paths 31a and 31b and the flow path 33a can be completely purged to prevent residual coolant liquid from remaining in all flow paths. Note, however, that the number of coarse adjustment members 51 is not limited to being the same as the number of openings 50a of the fine adjustment member 50 illustrated in FIG. 5(c). One or more coarse adjustment members 51 may be disposed at locations at each of which the N gas flow is interrupted.

As described above, according to the present embodiment, in the stage 11 on which the wafer W and the edge ring 30 are mounted, a two-stage adjustment mechanism, e.g., the fine adjustment member 50 and the coarse adjustment members 51 are provided at the bifurcation A that branches into the coolant flow path 31a and the coolant flow path 31b. Thereby, the flow ratio of the coolants that are diverted to the coolant flow paths 31a and 31b can be adjusted so that the amount of heat reduction can be controlled.

In particular, a given fine adjustment member 50 having the opening 50a, from among the plurality of fine adjustment members 50 that differ in the area of the opening 50a, is selected in accordance with a given process condition and is removably replaced. Thereby, an adjustment range for the coolant that flows to each of the wafer W side and the edge ring 30 side can be changed. Accordingly, the temperature control at each of the wafer W side and the edge ring 30 side can be performed to meet the process condition.

Further, when the coarse adjustment members 51 are disposed, residual coolant liquid can be prevented from remaining in the brine purge. Note that the fine adjustment member 50 is an example of a member having an opening that communicates with the coolant flow path 31a and the coolant flow path 31b. According to the present embodiment, the fine adjustment member 50 is provided at the bifurcation A, but is not limited thereto. The fine adjustment member 50 may be provided at least one of the bifurcation A and the junction B.

The coarse adjustment member 51 is an example of a protrusion member that is provided at least one of the bifurcation A and the junction B. According to the present embodiment, the coarse adjustment members 51 are provided at the bifurcation A, but are not limited thereto. The coarse adjustment members 51 may be provided at least one of the bifurcation A and the junction B.

It is more preferable that both of the fine adjustment member 50 and the coarse adjustment member 51 are provided at either of the bifurcation A or the junction B, and that a split control is performed at either the bifurcation A or the junction B. For example, in FIG. 3, the fine adjustment member 50 and the coarse adjustment members 51 are all provided in the flow path 33a at the bifurcation A, and are not provided in the flow path 34a at the junction B. However, the arrangement of the fine adjustment member 50 and the coarse adjustment members 51 is not limited to the configuration illustrated in FIG. 3. A configuration in which the fine adjustment member 50 and the coarse adjustment members 51 are provided in the flow path 34a at the junction B and are not provided in the flow path 33a at the bifurcation A, may be adopted.

The reason that it is better not to provide fine adjustment members 50 at both of the bifurcation A and the junction B is because, when the fine adjustment members 50 are at both of the bifurcation A and the junction B, the flow ratios for the coolant are adjusted at both of the bifurcation A and the junction B, so that a given flow ratio is not easily adjusted as designated. Further, when the fine adjustment member 50 and the coarse adjustment members 51 are separately disposed at the bifurcation A or the junction B, the coolant flow that exits the openings 50a of the fine adjustment member 50 cannot be interrupted by the coarse adjustment members 51, so that there are cases of residual liquid remaining in the brine purge.

In the case of the flow paths 33a and 34a each of which has a configuration in which residual liquid does not remain in the brine purge, the fine adjustment member 50 may be disposed at least one of the bifurcation A and the junction B, without providing any coarse adjustment member 51. In this case, one or more coarse adjustment members 51 may be provided at the bifurcation A or the junction B at which the fine adjustment member 50 is not disposed. One or more coarse adjustment members 51 may be disposed at least one of the bifurcation A and the junction B, without providing any fine adjustment member 50.

[Modifications]

As is the case with the configuration of the stage 11, a coolant flow path that branches into the inner periphery side and the outer periphery side of the showerhead 24 is provided in the showerhead 24, and the fine adjustment member may be provided at least one of a given bifurcation and a given junction of the coolant flow path. Also, one or more coarse adjustment members may be provided at least one of a given bifurcation and a given junction of the coolant flow path in the showerhead 24.

The showerhead 24 in such a configuration is an example of an electrode member that faces the stage 11 on which the wafer W is mounted. The showerhead 24 may include a first flow path (for example, a coolant flow path on the inner periphery side of the showerhead 24) and a second flow path (for example, a coolant flow path on the outer periphery side of the showerhead 24) along each of which a fluid flows, within the electrode member; a bifurcation at which an inlet port of the first flow path and an inlet port of the second flow path are coupled; a junction at which an outlet port of the first flow path and an outlet port of the second flow path are coupled; and a member (for example, a fine adjustment member) that is provided at least one of the bifurcation and the junction and that has at least one opening that communicates with the first flow path and the second flow path. Further, the showerhead 24 may include a given coarse adjustment member 51 as an example of a protrusion member that is provided at least one of the bifurcation and the junction.

According to the present embodiment, the coolant flows to the first flow path and the second flow path. However, the fluid that flows to the first flow path and the second flow path is not limited to liquid, and a gas may be used. In other words, the fine adjustment member 50 and the coarse adjustment members 51 can be disposed at a given bifurcation or a given junction corresponding to the member in which a given fluid flow path is provided. For example, the fine adjustment member 50 and the coarse adjustment members 51 can be used for a flow path along which a He gas flows, within the stage 11. For example, a case is assumed in which the gas supply line in FIG. 1, along which a He gas flows, has the structure that branches into: the wafer side line 36a extending to the central portion 25a of the electrostatic chuck 25, as well as an edge ring side line not illustrated that extends to the outer periphery 25b of the electrostatic chuck. In this case, at least one of the fine adjustment member 50 and the coarse adjustment member 51 may be disposed at a given bifurcation into the above two gas lines. Thereby, a split ratio for the He gas that flows to the wafer side line 36a and the edge ring side line can be variably adjusted.

Further, when the buffer chamber 39 in FIG. 1 includes an inner periphery side chamber and an outer periphery side chamber, at least one of the fine adjustment member 50 and the coarse adjustment member 51 may be provided at a given bifurcation that branches into the inner periphery side chamber and the outer periphery side chamber. Thereby, the process gas supplied by the process gas supply 40 can be diverted to the inner periphery side chamber and the outer periphery side chamber, at a predetermined flow ratio.

As described above, according to the present embodiment, the flow ratio for the coolant or the gas that circulates through the stage 11 on which the wafer and the edge ring 30 are mounted, and that flows to the wafer side and the edge ring side, can be adjusted, so that an amount of heat reduction or an amount of heat transfer can be controlled at each of the wafer side and the edge ring side.

Further, according to the modification of the present embodiment, the flow ratio for the coolant circulating through the showerhead 24, or for the gas flowing to the inner periphery side chamber and the outer periphery side chamber in the buffer chamber 39, can be adjusted, so that an amount of heat reduction at each of the inner periphery side and the outer periphery side of the showerhead 24 can be controlled.

It should be understood that the stage and the electrode member according to one embodiment disclosed in this description are examples in all respects and are not restricted. Various changes and modifications to the above embodiments can be made without departing from the scope and spirit set forth in the appended claims. The matters described in the above embodiments can be taken by other configurations to the extent not inconsistent, and can be combined to the extent not inconsistent.

The processing apparatus in the present disclosure is applicable to any type from among a capacitively coupled plasma (CCP), an inductively coupled plasma (ICP), a radial line slot antenna (RLSA), an electron cyclotron resonance plasma (ECR), and a helicon wave plasma (HWP).

The wafer W has been described in the specification as an example of a substrate. However, the substrate is not be limited to the wafer, and may include any substrate used in a flat panel display (FPD); a printed board; or the like.

This international application claims priority to Japanese Patent Application No. 2018-136095, filed Jul. 19, 2018, the contents of which are incorporated herein by reference in their entirety.

REFERENCE SIGNS LIST 1 substrate processing apparatus
10 processing chamber
11 stage
11a base
21a first radio frequency power source
21b second radio frequency power source
24 showerhead
25 electrostatic chuck
25a central portion
25b outer periphery
26 electrode
27 dc power source
23 dc power source
29 electrode
30 edge ring
31a, 31b coolant flow path
32 chiller unit
43 controller
50 fine adjustment member
50a1, 50a2 opening
51a, 51b, 51 coarse adjustment member
52 O-ring
A bifurcation
B junction
W wafer

The invention claimed is:
1. A stage for mounting a workpiece and an edge ring, the stage comprising:
a first flow path and a second flow path along each of which a fluid flows, within the stage;
a bifurcation at which an inlet port of the first flow path and an inlet port of the second flow path are coupled;
a junction at which an outlet port of the first flow path and an outlet port of the second flow path are coupled; and
a member provided at least one of the bifurcation and the junction, the member having at least one opening that communicates with the first flow path and the second flow path.

2. The stage according to claim 1, further comprising at least one protrusion member provided at least one of the bifurcation and the junction.

3. The stage according to claim 2, wherein the member having the opening and the protrusion member are provided at either of the bifurcation or the junction.

4. The stage according to claim 3, wherein the protrusion member is provided at a location at which a fluid flow entering from the opening in the member is interrupted.

5. The stage according to claim 1, wherein the at least one opening in the member is a plurality of openings.

6. The stage according to claim 1, wherein the member having the opening is removably provided.

7. The stage according to claim 1, wherein the first flow path is disposed at a location corresponding to a given mounting surface on which the workpiece is mounted, from among mounting surfaces of the stage.

8. The stage according to claim 1, wherein the second flow path is disposed at a location corresponding to a given mounting surface on which the edge ring is mounted, from among mounting surfaces of the stage.

9. A stage for mounting a workpiece and an edge ring, the stage comprising:
 a first flow path and a second flow path along each of which a fluid flows, within the stage;
 a bifurcation at which an inlet port of the first flow path and an inlet port of the second flow path are coupled;
 a junction at which an outlet port of the first flow path and an outlet port of the second flow path are coupled; and
 at least one protrusion member provided at least one of the bifurcation and the junction.

10. The stage according to claim 9, wherein the at least one protrusion member is a plurality of protrusion members.

11. The stage according to claim 9, wherein the first flow path is disposed at a location corresponding to a given mounting surface on which the workpiece is mounted, from among mounting surfaces of the stage.

12. The stage according to claim 9, wherein the second flow path is disposed at a location corresponding to a given mounting surface on which the edge ring is mounted, from among mounting surfaces of the stage.

13. An electrode member configured to face a stage for mounting a workpiece, the electrode member comprising:
 a first flow path and a second flow path along each of which a fluid flows, within the electrode member;
 a bifurcation at which an inlet port of the first flow path and an inlet port of the second flow path are coupled;
 a junction at which an outfit port of the first flow path and an outlet port of the second flow path are coupled; and
 a member provided at least one of the bifurcation and the junction, the member having at least one opening that communicates with the first flow path and the second flow path.

14. The electrode member according to claim 13, further comprising at least one protrusion member provided at least one of the bifurcation and the junction.

\* \* \* \* \*